United States Patent
Omi et al.

(10) Patent No.: US 7,816,749 B2
(45) Date of Patent: Oct. 19, 2010

(54) PHOTOELECTRIC CONVERSION DEVICE AND METHOD OF PRODUCING THE SAME, AND METHOD OF PRODUCING LINE IMAGE SENSOR IC

(75) Inventors: Toshihiko Omi, Chiba (JP); Yoichi Mimuro, Chiba (JP)

(73) Assignee: Seiko Instruments Inc., Chiba (JP)

( * ) Notice: Subject to any disclaimer, the term of this patent is extended or adjusted under 35 U.S.C. 154(b) by 390 days.

(21) Appl. No.: 11/963,560

(22) Filed: Dec. 21, 2007

(65) Prior Publication Data

US 2009/0273050 A1    Nov. 5, 2009

(30) Foreign Application Priority Data

Dec. 26, 2006    (JP)    ............... 2006-348989

(51) Int. Cl.
    *H01L 23/544*    (2006.01)

(52) U.S. Cl. ................. 257/431; 257/260; 257/E31.11; 257/E31.117

(58) Field of Classification Search ................. 257/431, 257/621; 438/68, 460, 462
See application file for complete search history.

(56) References Cited

U.S. PATENT DOCUMENTS

| | | | |
|---|---|---|---|
| 6,261,883 B1 * | 7/2001 | Koubuchi et al. | ............ 438/197 |
| 6,833,622 B1 * | 12/2004 | Zagrebelny et al. | ......... 257/752 |
| 7,687,914 B2 * | 3/2010 | Kuroda et al. | ............... 257/758 |
| 7,701,034 B2 * | 4/2010 | Chuang et al. | ............. 257/508 |
| 2009/0250792 A1* | 10/2009 | Liou et al. | .................. 257/620 |
| 2010/0072578 A1* | 3/2010 | Kunishima | .................. 257/620 |

FOREIGN PATENT DOCUMENTS

JP    6-260625 A    9/1994

* cited by examiner

*Primary Examiner*—David A Zarneke
(74) *Attorney, Agent, or Firm*—Brinks Hofer Gilson & Lione

(57) ABSTRACT

A plurality of line image sensor ICs 110 are formed to be arranged in X, Y directions with gaps therebetween on a semiconductor substrate 101. The gaps between the line image sensor ICs 110 become scribe lines 102X, 102Y. A pattern of dummy interconnects 120 is formed in a region where a short side 110S of an arbitrary line image sensor IC 110 is opposed to a short side 110S of another line image sensor IC 110 adjacent to the arbitrary line image sensor IC 110 in the X direction in a region where the scribe line 102Y is formed. When a material gas is generated by plasma CVD, the material gas is uniformly deposited not only on the line image sensor ICs 110, but also on the dummy interconnects 120. Consequently, a protective film with a uniform thickness can be formed on the line image sensor ICs 110.

5 Claims, 9 Drawing Sheets

Prior Art

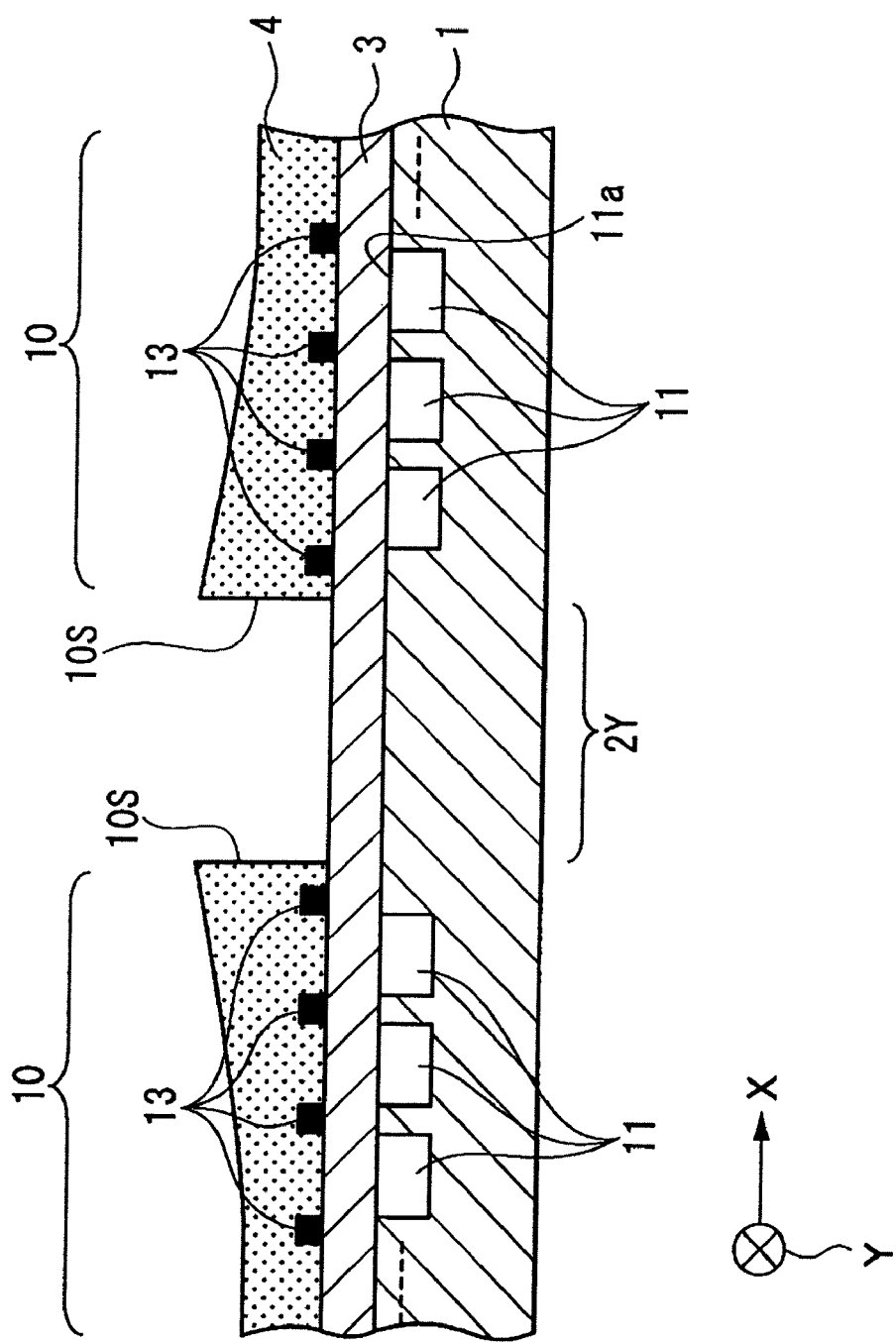

PHOTOELECTRIC CONVERSION DEVICE AND METHOD OF PRODUCING THE SAME, AND METHOD OF PRODUCING LINE IMAGE SENSOR IC

This application claims priority under 35 U.S.C. §119 to Japanese Patent Application No. JP2006-348989 filed Dec. 26, 2006, the entire content of which is hereby incorporated by reference.

FIELD OF THE INVENTION

The present invention relates to a photoelectric conversion device and a method of producing the same, and a method of producing a line image sensor IC, in which reduction of variation in electric signal values sent from respective photoelectric conversion elements placed in a line image sensor IC is performed.

DESCRIPTION OF THE RELATED ART

An image reader such as an image scanner and a facsimile includes a line image sensor IC in a reading portion in order to read an image.

The line image sensor IC has an elongated rectangular shape. In such a line image sensor IC, a plurality of (e.g., 400) photoelectric conversion elements (light-receiving elements, pixels) are placed so as to be aligned in a row in a longitudinal direction, and electric interconnects formed of a conductive material such as aluminum are placed in a region adjacent to a region where the photoelectric conversion elements are placed.

In a line image sensor IC, in order to protect a light-receiving surface of the photoelectric conversion element, a transparent protective film is formed so as to cover the surface of a semiconductor substrate (light-receiving surface of the photoelectric conversion element). As the protective film, a silicon nitride (SiN) film or the like formed by plasma chemical vapor deposition (CVD) is adopted.

Herein, the configuration of a photoelectric conversion device in which a plurality of line image sensor ICs are formed on a semiconductor substrate (semiconductor wafer) will be described with reference to FIG. 7 and FIG. 8 showing a cross-section taken along a line A-A in FIG. 7. In FIGS. 7 and 8, the dimension of each member is not drawn to scale for ease of understanding of the configuration.

As shown in FIGS. 7 and 8, in the photoelectric conversion device, a plurality of line image sensor ICs 10 are formed on the surface of a semiconductor substrate (semiconductor wafer) 1. For example, in the case where a wafer diameter of the semiconductor substrate 1 is 6 inches, thousands of line image sensor ICs 10 are formed on one semiconductor substrate 1.

In each line image sensor IC 10 having an elongated rectangular shape, a plurality of (e.g.,400) photoelectric conversion elements 11 are placed so as to be aligned in a row in a longitudinal direction (X direction).

The horizontal direction size (X-direction size) of the line image sensor IC 10 is, for example, 10 to 20 mm, and the vertical direction size (Y-direction size) thereof is, for example, 0.3 to 0.5 mm. Such line image sensor ICs 10 are formed adjacent to each other in the horizontal direction (X direction) and the vertical direction (Y direction) with a gap therebetween on the surface of the semiconductor substrate 1.

Then, the gaps between the adjacent line image sensor ICs 10 form scribe line 2X, 2Y. The scribe line 2X extending in the horizontal direction (X direction) is formed along a long side 10L of the rectangular line image sensor IC 10, and the scribe line 2Y extending in the vertical direction (Y direction) is formed along a short side 10S of the rectangular line image sensor IC 10.

In other words, the scribe lines 2X and the scribe lines 2Y form a lattice shape, and each line image sensor IC 10 placed in the horizontal and vertical directions (XY directions) is surrounded by the scribe lines 2X, 2Y.

Widths WX, WY of the respective scribe lines 2X, 2Y are respectively 50 μm to 200 μm.

A transparent insulating separation film (oxide film) 3 is formed on the surface of the semiconductor substrate 1. On the surface of the insulating separation film 3, electric interconnects 12 made of aluminum are formed in a region (where the photoelectric conversion elements 11 are not formed) adjacent to a region where the photoelectric conversion elements 11 are formed, which is in a region where the line image sensor ICs 10 are formed. The electric interconnects 12 are electrically connected to the photoelectric conversion elements 11. In FIG. 7, the electric interconnects 12 are not shown.

On the surface of the insulating separation film 3, inter-pixel light shielding aluminum for light shielding (not shown) is placed at a position between the adjacent photoelectric conversion elements 11 in the region where the line image sensor ICs 10 are formed.

A transparent protective film 4 made of silicon nitride (SiN) or the like is formed on the surface of the insulating separation film 3 by plasma CVD. That is, the protective film 4 is formed so as to cover a light-receiving surface 11a of the photoelectric conversion element 11 with the insulating separation film 3 interposed therebetween.

Then, the semiconductor substrate 1 is cut along the scribe lines 2X, 2Y by dicing machine (cutting machine), whereby the line image sensor ICs 10 which are independent of each other are produced.

In order to read an image exactly with the line image sensor IC incorporated in an image reader such as an image scanner, it is necessary that the values of electric signals sent from the respective photoelectric conversion elements 11 are the same when the same amount of light is incident upon the respective photoelectric conversion elements 11.

However, since the protective film 4 is formed by plasma CVD, the thickness thereof varies depending upon the arrangement state of the electric interconnects 12 and the inter-pixel light shielding aluminum. When the thickness of the protective film 4 varies, the reflection and interference conditions on the protective film 4 and the insulating separation film 3 change, with the result that the amount of light actually incident upon each of the photoelectric conversion elements 11 changes. In such a circumstance, even if light of the same amount is incident upon each of the photoelectric conversion elements 11, the amount of light actually incident upon each of the photoelectric conversion elements 11 becomes different. As a result, the values of electric signals sent from the respective photoelectric conversion elements 11 vary.

Hereinafter, the reason for the reflection and interference conditions change on the protective film 4 and the insulating separation film 3 due to the difference in thickness of the protective film 4 will be described further.

When light is incident upon the photoelectric conversion element 11 from outside of the line image sensor IC 10, a part of the incident light is reflected by the interface between the protective film 4 and the insulating separation film 3, and the interface between the insulating separation film 3 and the light-receiving surface 11a of the photoelectric conversion element 11. The reflected light is reflected again by the surface of the protective film 4 and the interface between the protective film 4 and the insulating separation film 3 to cause multiple-beam interference. At this time, when the thickness of the protective film 4 varies, the reflection and interference conditions change due to the thickness, and the amount of light actually incident upon each of the photoelectric conversion elements 11 varies, with the result that the values (voltage values) of electric signals sent from the respective photoelectric conversion elements 11 vary.

FIG. 9 shows the output characteristics of each of the photoelectric conversion elements (pixels) 11 when the thickness of the protective film 4 changes in a conventional line image sensor IC 10. Solid line indicates a voltage ratio of electric signals sent from the respective photoelectric conversion elements 11, and dotted line indicates a thickness ratio of the protective film 4 formed above the respective photoelectric conversion elements 11.

FIG. 9 shows that, when the thickness of the protective film 4 changes, the voltage of electric signals sent from the respective photoelectric conversion elements 11 changes.

In FIG. 9, when the thickness ratio (thickness) of the protective film 4 increases, the values of electric signals sent from the photoelectric conversion elements 11 increase. However, the values of electric signals sent from the photoelectric conversion elements 11 may decrease when the thickness ratio (thickness) of the protective film 4 increases, depending upon the reflection and interference conditions.

As a method for suppressing the variation in values of electric signals sent from respective photoelectric conversion elements caused by the variation in thickness of the protective film, unevenness is made on the surface of the protective film (e.g., see Japanese Patent Application Laid-open No. 06-260625). According to this method, the size of one pitch of unevenness made on the surface of the protective film is set to be smaller than the size in a vertical direction and the size in a horizontal direction of the light-receiving surface of the photoelectric conversion element. A number of light beams having different interference conditions are, therefore, incident upon one photoelectric conversion element, whereby the interference effects of the respective light beams are cancelled. As a result, the amount light actually incident upon each photoelectric conversion element is uniformized, and the values of electric signals sent from respective photoelectric conversion elements are uniformized.

Further, as another method for suppressing the variation in values of electric signals sent from respective photoelectric conversion elements caused by the variation in thickness of the protective film, there is known a method in which a portion of the protective film positioned above the light-receiving surface of the photoelectric conversion element is removed.

Forming unevenness with a short pitch size on the surface of the protective film as in the method shown in Japanese Patent Application Laid-open No. 06-260625 is actually a very difficult operation. Further, there is a fear that the variation in the values of electric signals becomes larger depending upon the size and shape of unevenness.

Further, according to the technique of removing a portion of the protective film positioned above the light-receiving surface of the photoelectric conversion element, the protective film for protecting the photoelectric conversion element is removed, so the protection of the photoelectric conversion element becomes insufficient.

A further basic problem lies in that the cause and mechanism of variation in thickness of the protective film 4 are not accurately clarified.

That is, only the following (1) and (2) have conventionally been predicted.

(1) When the protective film 4 is formed by plasma CVD while the semiconductor substrate 1 is placed in a film-formation chamber, the density of material gas (material that is plasmolyzed) in the film-formation chamber changes due to the variation in electric field conditions in the film-formation chamber.

(2) Since the electric interconnects 12 and the inter-pixel light shielding aluminum are made of a conductive material (aluminum), the electric field conditions in the film-formation chamber change depending upon the arrangement state of the electric interconnects 12 and the inter-layer light shielding aluminum.

Although, conventionally, the above (1) and (2) can be predicted, it has not been clarified in which portion of the protective film 4 and by which mechanism the thickness increases/decreases depending upon the arrangement state of the conductive material.

Inventor of the present invention studied earnestly the relationship between the change (variation) in thickness of the protective film 4 and the arrangement of the conductive material, and consequently, found out the causal relationship between the change in thickness of the protective film 4 and the arrangement of the conductive material.

Hereinafter, the causal relationship between the change (variation) in thickness of the protective film 4 and the arrangement of the conductive material, found out by the inventor of the present invention, will be described with reference to FIG. 10 that shows a cross-section taken along a line B-B in FIG. 7.

In FIG. 10, reference numeral 1 denotes a semiconductor substrate (semiconductor wafer), 2Y denotes a scribe line, 3 denotes an insulating separation film, 4 denotes a protective film, 10 denotes a line image sensor IC, 10S denotes a short side of the line image sensor IC 10, 11 denotes a photoelectric conversion element, and 13 denotes inter-pixel light shielding aluminum.

The inter-pixel light shielding aluminum 13 is placed at a position between adjacent photoelectric conversion elements 11 in a region where the line image sensor ICs 10 are formed on the surface of the insulating separation film 3.

In FIG. 10, the electric interconnects 12 are present although not shown.

As shown in FIG. 10, in each of the line image sensor ICs 10, a plurality of (about 400) photoelectric conversion elements 11 are placed so as to be aligned in a row in a longitudinal direction (X direction). The protective film 4 is formed so as to cover the light-receiving surfaces 11a of the photoelectric conversion elements 11 with the insulating separation film 3 interposed therebetween.

The inventor of the present invention conducted experiments and observations, whereby the inventor found the fact that the thickness of the protective film 4 at an end in the longitudinal direction (X direction) of the line image sensor IC 10 is larger than that at a center in the longitudinal direction (X direction) of the line image sensor IC 10.

That is, the inventor of the present invention found the fact that the thickness of the protective film 4 formed on the photoelectric conversion element 11 positioned on an end side (short side 10S side) among the photoelectric conversion elements 11 arranged in a row in the longitudinal direction (X direction) is larger than that of the protective film 4 formed on the photoelectric conversion element 11 positioned at the center portion (center of the long side 10L) among the photoelectric conversion elements 11 arranged in a row in the longitudinal direction (X direction).

Thus, the inventor of the present invention clarified that the cause of the change in thickness of the protective film 4 depends on presence and absence of the conductive material (aluminum) on the semiconductor substrate 1, and on the arrangement density and wiring density of the conductive material when the conductive material is present.

More specifically, it was clarified that the electric field conditions in a space close to a portion where the conductive material is not present on the semiconductor substrate 1, in the space of the film-formation chamber, do not change, and the thickness of the protective film 4 becomes relatively small on the surface of the portion where the conductive material is not present.

Further, the following was clarified: the conductive material functions in the same way as in an antenna in a portion where the conductive material is present on the semiconductor substrate 1, so the electric field intensity in the space close to the portion where the conductive material is present in the space of the film-formation chamber becomes larger, and the thickness of the protective film 4 formed on the surface of the portion where the conductive material is present becomes larger.

Further, it was clarified that the function of the conductive material similar to that of the antenna becomes stronger as the arrangement density and wiring density of the conductive material are higher, and the thickness of the protective film 4 becomes larger.

On the other hand, the following was also clarified. In the case where the arrangement density and wiring density of the conductive material are low and the conductive material has a flat surface, the function of the conductive material similar to that of the antenna becomes weaker, and the thickness of the protective film 4 is larger than that in the case where the conductive material is not present; however, the increase in thickness can be suppressed.

Referring to FIG. 10, the conductive material (aluminum) is not present in a portion where the scribe line 2Y is formed on the surface of the semiconductor substrate 1, so relatively thin deposition (film formation) of a material gas (plasmolyzed material) is performed.

On the other hand, in a portion where the line image sensor IC 10 is formed on the surface of the semiconductor substrate 1, the inter-pixel light shielding aluminum 13 and the electric interconnects 12 made of a conductive material (aluminum) are present, so the film formation of the material gas (plasmolyzed material) is promoted.

Further, film formation is not performed in the portion where the scribe line 2Y is formed, so the material gas (plasmolyzed material) proceeding toward the scribe line 2Y proceeds toward the end in the longitudinal direction (X direction) of the line image sensor IC 10, and is deposited to form a film at the end in the longitudinal direction (X direction) of the line image sensor IC 10.

Consequently, at the end in the longitudinal direction (X direction) of the line image sensor IC 10, the material gas (plasmolyzed material) that originally proceeds toward the end and the material gas (plasmolyzed material) that originally proceeds toward the scribe line 2Y, but thereafter, changes the direction to proceed toward the end of the line image sensor IC 10 overlap each other to be deposited to form a film.

As a result, it was clarified that the thickness of the protective film 4 at the end in the longitudinal direction (X direction of the line image sensor IC 10 becomes larger than that of the protective film 4 at the center in the longitudinal direction (X direction) of the line image sensor IC 10.

A test element group (TEG) may be placed in a part of the region where the scribe lines 2X, 2Y are formed on the surface of the semiconductor substrate 1. However, the wiring density of the electric interconnects of the TEG is low, so the thickness of a protective film to be deposited on the scribe lines 2X, 2Y becomes smaller even in the case where the TEG is placed, and the phenomenon in which the thickness of the protective film 4 becomes larger occurs at the end in the longitudinal direction (X direction) of the line image sensor IC 10.

SUMMARY OF THE INVENTION

The object of the present invention is to provide, based on the finding that there is a causal relationship between the change in thickness of the protective film and the arrangement of a conductive material described with reference to FIG. 10, a photoelectric conversion device, a method of producing the same, and a method of producing a line image sensor IC in which the thickness of a protective film formed on the line image sensor IC is uniform, whereby the values of electric signals sent from the photoelectric conversion elements placed in each line image sensor IC can be uniform.

In order to solve the above-mentioned problems, according to the present invention, there is provided a photoelectric conversion device, including:

a semiconductor substrate;

a plurality of rectangular line image sensor ICs formed on a surface of the semiconductor substrate with gaps therebetween;

a plurality of scribe lines formed in the gaps between adjacent line image sensor ICs;

a plurality of dummy interconnects made of a conductive material formed in a region where a short side of an arbitrary line image sensor IC is opposed to a short side of another line image sensor IC adjacent to the arbitrary line image sensor IC in a region where one of the plurality of scribe lines is formed along the plurality of short sides of the plurality of rectangular line image sensor ICs; and a protective film formed by plasma CVD so as to cover the plurality of dummy interconnects as well as the surface of the semiconductor substrate.

Further, according to the present invention, there is provided a photoelectric conversion device, including:

a semiconductor substrate;

a plurality of rectangular line image sensor ICs formed on a surface of the semiconductor substrate with gaps therebetween;

a plurality of scribe lines formed in the gaps between adjacent line image sensor ICs;

a plurality of dummy interconnects made of a conductive material formed in a region where a short side of an arbitrary line image sensor IC is opposed to a short side of another line image sensor IC adjacent to the arbitrary line image sensor IC in a region where one of the plurality of scribe lines is formed along the short sides of the plurality of rectangular line image sensor ICs; and a protective film formed by plasma CVD so as to cover the plurality of dummy interconnects as well as the surface of the semiconductor substrate, in which the plurality of dummy interconnects are formed in a pattern in which a distribution density of the plurality of dummy interconnects is uniform, and an interval between the plurality of dummy interconnects is equal to a smallest interval among intervals between electric interconnects formed in each of the plurality of line image sensor ICs.

Further, according to the present invention, there is provided a photoelectric conversion device, including:

a semiconductor substrate;

a plurality of rectangular line image sensor ICs formed on a surface of the semiconductor substrate with gaps therebetween;

a plurality of scribe lines formed in the gaps between adjacent line image sensor ICs;

a plurality of dummy interconnects made of a conductive material formed in a region at a center between a short side of an arbitrary line image sensor IC and a short side of another line image sensor IC adjacent to the arbitrary line image sensor IC in a region where one of the plurality of scribe lines is formed along the short sides of the plurality of rectangular line image sensor ICs, among the plurality of scribe lines; and a protective film formed by plasma CVD so as to cover the plurality of dummy interconnects as well as the surface of the semiconductor substrate, in which the plurality of dummy interconnects are formed in a pattern in which a distribution density of the plurality of dummy interconnects is uniform, and an interval between the plurality of dummy interconnects is equal to a smallest interval among intervals between electric interconnects formed in each of the plurality of line image sensor ICs.

Further, according to the present invention, there is provided a method of producing the photoelectric conversion device, including:

forming a plurality of photoelectric conversion elements to be light-receiving portions of a line image sensor IC on a surface of a semiconductor substrate;

forming an insulating film on the surface of the semiconductor substrate on which the plurality of photoelectric conversion elements are formed;

depositing a conductive film on a surface of the insulating film, and etching the deposited conductive film, thereby forming a plurality of electric interconnects, an inter-pixel light shielding conductive material positioned between the plurality of photoelectric conversion elements, and a plurality of dummy interconnects positioned between a short side of an arbitrary line image sensor IC and a short side of another line image sensor IC adjacent to the arbitrary line image sensor IC; and forming a protective film by plasma CVD on the surface of the insulating film on which the plurality of electric interconnects, the inter-pixel light shielding conductive material, and the plurality of dummy interconnects are formed.

Further, according to the present invention, there is provided a method of producing an independent line image sensor IC by cutting the photoelectric conversion device along scribe lines, including:

forming a plurality of photoelectric conversion elements to be light-receiving portions of the line image sensor IC on a surface of a semiconductor substrate;

forming an insulating film on the surface of the semiconductor substrate on which the plurality of photoelectric conversion elements are formed;

depositing a conductive film on a surface of the insulating film, and etching the deposited conductive film, thereby forming a plurality of electric interconnects, an inter-pixel light shielding conductive material positioned between the photoelectric conversion elements, and a plurality of dummy interconnects positioned between a short side of an arbitrary line image sensor IC and a short side of another line image sensor IC adjacent to the arbitrary line image sensor IC;

forming a protective film by plasma CVD on the surface of the insulating film on which the plurality of electric interconnects, the inter-pixel light shielding conductive material, and the plurality of dummy interconnects are formed to form the photoelectric conversion device; and cutting the photoelectric conversion device along the scribe lines to produce the independent line image sensor IC.

According to the present invention, dummy interconnects made of a conductive material are formed in a region where scribe lines are formed in gaps between a plurality of line image sensor ICs formed on a semiconductor substrate and where a short side of an arbitrary line image sensor IC is opposed to a short side of another line image sensor IC adjacent to the arbitrary line image sensor IC.

Thus protective film is formed not only on the line image sensor ICs, but also on the dummy interconnects when the protective film is formed by plasma CVD. Accordingly, a material gas that proceeds toward the dummy interconnects in the plasmolyzed material gas is deposited to form a film on the dummy interconnects, and does not flow to the line image sensor IC side. Consequently, the thickness of the protective film formed on the line image sensor IC is uniformized in any portion in the longitudinal direction.

As a result the thickness of the protective film on the line image sensor IC is uniformized, so the reflection and interference conditions by the protective film become equal in any portion in the longitudinal direction, whereby the variation in values of electric signals sent from a plurality of photoelectric conversion elements provided in the line image sensor ICs can be suppressed.

BRIEF DESCRIPTION OF THE DRAWINGS

FIG. 10 shows a cross-sectional view take along a line B-B in FIG. 7.

DETAILED DESCRIPTION OF THE PREFERRED EMBODIMENTS

The best mode for carrying out the present invention will be described in detail by way of embodiments.

Preferred Embodiment 1

Figure 1:
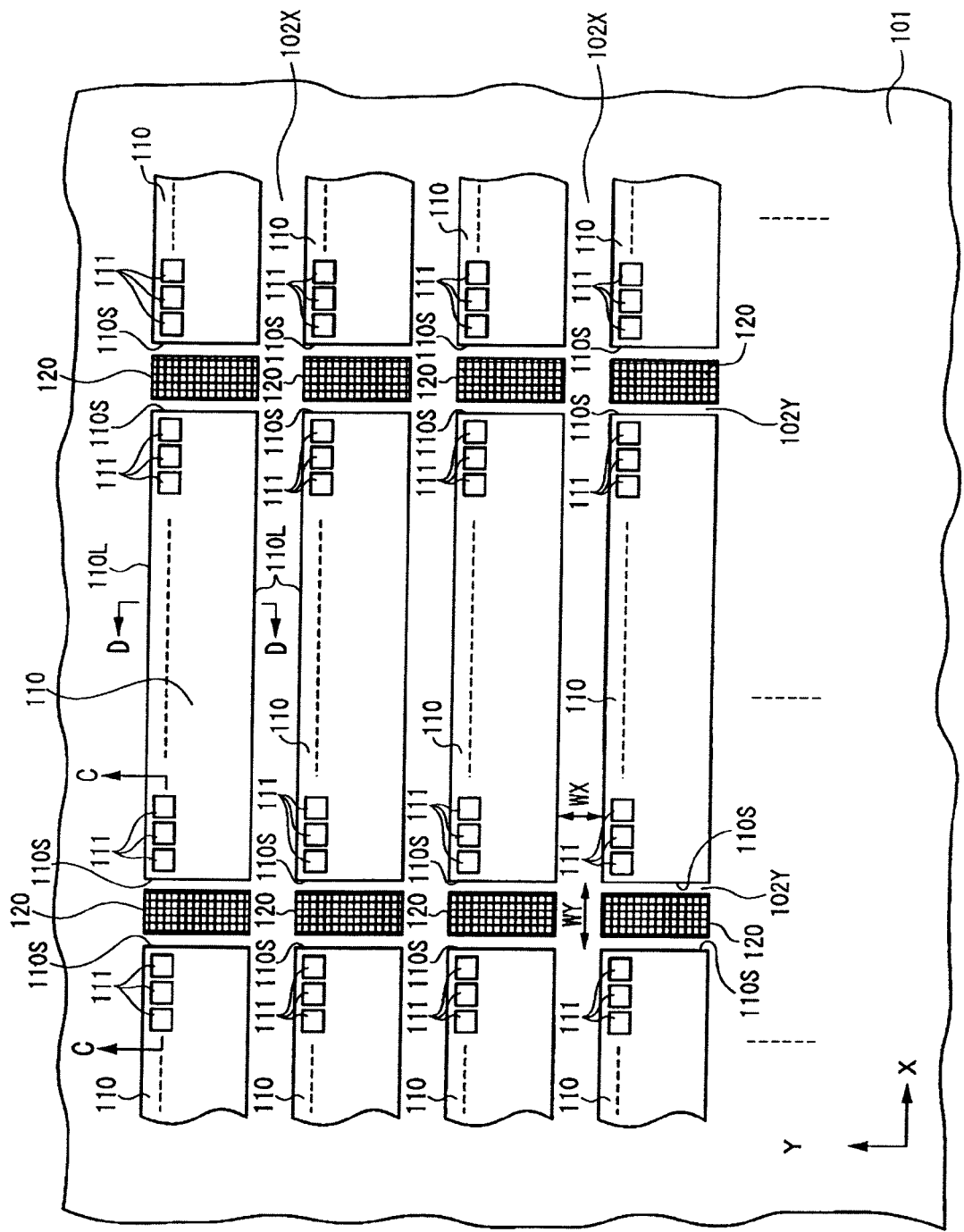
FIG. 1 shows a plan view showing a photoelectric conversion device according to Embodiment 1 of the present invention.
Figure 2:
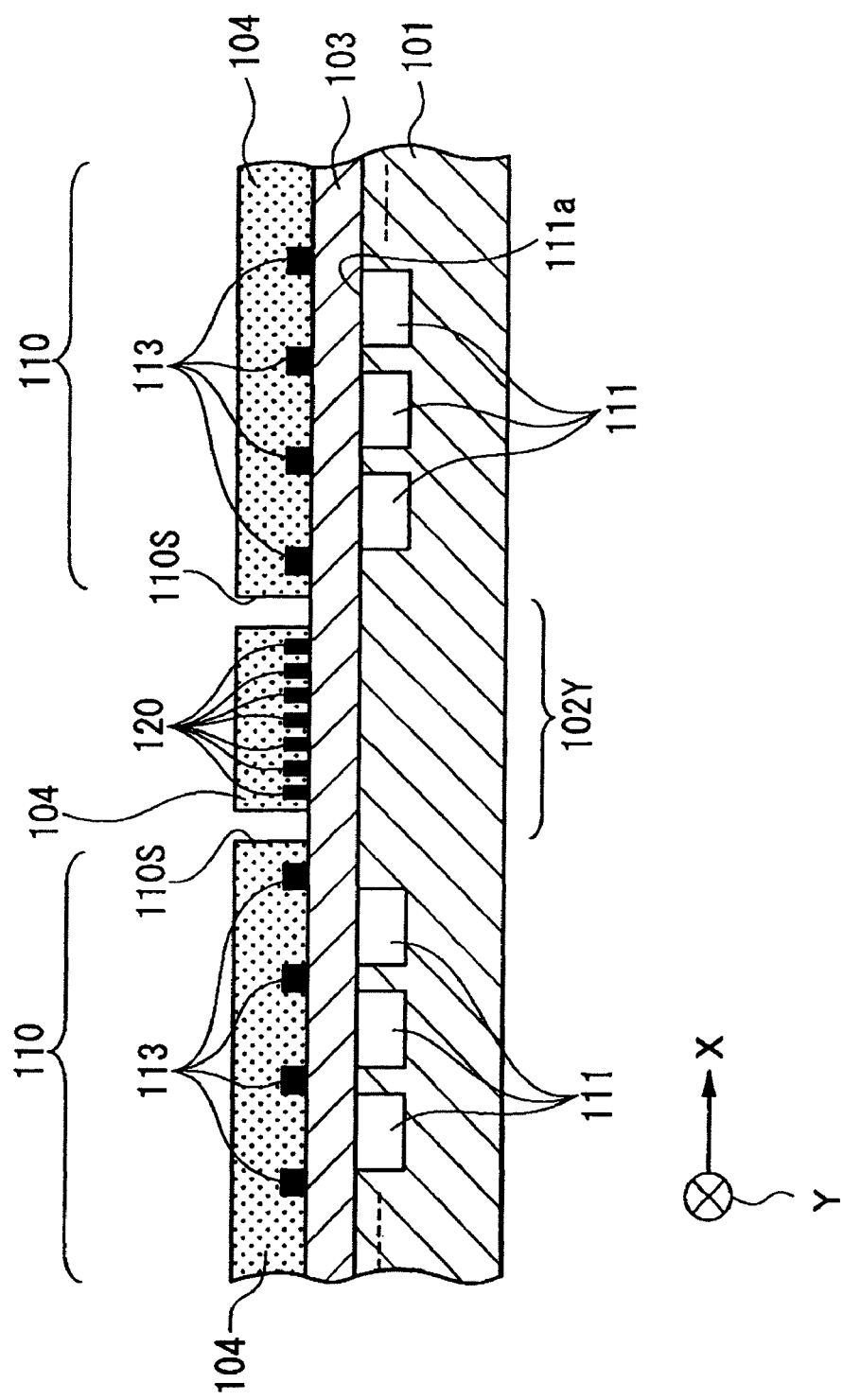
FIG. 2 shows a cross-sectional view taken along a line C-C in FIG. 1.
Figure 3:
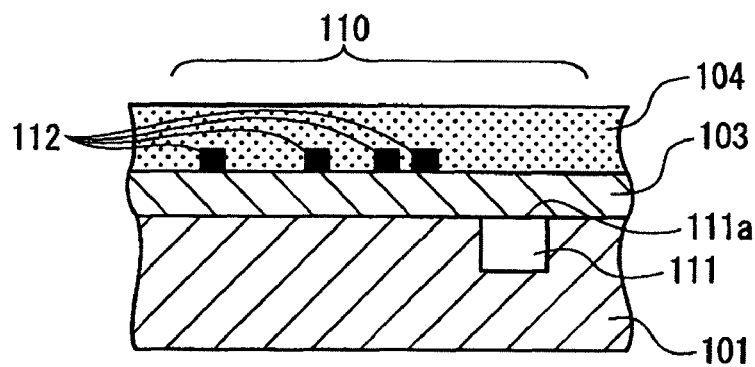
FIG. 3 shows a cross-sectional view taken along a line D-D in FIG. 1.

A photoelectric conversion device according to Embodiment 1 of the present invention, i.e., a photoelectric conversion device in which a plurality of line image sensor ICs are formed on a semiconductor substrate (semiconductor wafer) will be described with reference to FIG. 1, FIG. 2 showing a cross-section taken along a line C-C in FIG. 1, and FIG. 3 showing a cross-section taken along a line D-D in FIG. 1. In FIGS. 1 to 3, each member is not drawn to scale for ease of understanding of the configuration As shown in FIGS. 1 to 3, a plurality of line image sensor ICs 110 are formed on the surface of a semiconductor substrate (semiconductor wafer) 101 in the photoelectric conversion device. For example, in the case where a wafer diameter of the semiconductor substrate 101 is 6 inches, thousands of line image sensor ICs 110 are formed on one semiconductor substrate 101.

In each line image sensor IC 110 having an elongated rectangular shape, a plurality of (for example, 400) photoelectric conversion elements 111 are placed so as to be arranged in a row in a longitudinal direction (X direction).

The horizontal direction size (X-direction size) of the line image sensor IC 110 is, for example, 10 to 20 mm, and the vertical direction size (Y-direction size) thereof is, for example, 0.3 to 0.5 mm. Such line image sensor ICs 110 are formed adjacent to each other in the horizontal direction (X direction) and the vertical direction (Y direction) with a gap therebetween on the surface of the semiconductor substrate 101.

Then, the gaps between the adjacent line image sensor ICs 110 form scribe line 102X, 102Y. The scribe line 102X extending in the horizontal direction (X direction) is formed along a long side 110L of the rectangular line image sensor IC 110, and the scribe line 102Y extending in the vertical direction (Y direction) is formed along a short side 110S of the rectangular line image sensor IC 110.

In other words, the scribe lines 102X and the scribe lines 102Y are formed in a lattice shape, and each line image sensor IC 110 placed in the horizontal and vertical directions (XY directions) is surrounded by the scribe lines 102X, 102Y.

Widths WX, WY of the respective scribe lines 102X, 102Y are respectively 50 μm to 200 μm, for example.

A transparent insulating separation film (oxide film) 103 is formed on the surface of the semiconductor substrate 101. On the surface of the insulating separation film 103, electric interconnects 112 made of aluminum are formed in a region (where the photoelectric conversion elements 111 are not formed) adjacent to a region where the photoelectric conversion elements 111 are formed, which is in a region where the line image sensor ICs 110 are formed. The electric interconnects 112 are electrically connected to the photoelectric conversion elements 111.

On the surface of the insulating separation film 103, inter-pixel light shielding aluminum 113 for light shielding is placed at a position between the adjacent photoelectric conversion elements 111 in the region where the line image sensor ICs 110 are formed.

A transparent protective film 104 made of silicon nitride (SiN) or the like is formed on the surface of the insulating separation film 103 by plasma CVD. That is, the protective film 104 is formed so as to cover a light-receiving surface 111a of the photoelectric conversion element 111 with the insulating separation film 103 interposed therebetween.

Further, as shown in FIG. 2, the thickness of the protective film 104 is uniform in any portion in the longitudinal direction (X direction) of the line image sensor IC 110. That is, the thickness of the protective film 104 formed above the photoelectric conversion elements 111 is uniform in any portion in the longitudinal direction (X direction) of the line image sensor IC 110. The reason and mechanism for setting the thickness of the protective film 104 to be uniform as described above will be described later.

In this embodiment, dummy interconnects 120 made of aluminum (conductive material) are formed in a region where a short side 110S of an arbitrary line image sensor IC 110 (end of an arbitrary line image sensor IC 110) is opposed to a short side 110S of another line image sensor IC 110 which is adjacent to the arbitrary line image sensor IC (end of another line image sensor IC 110) (in a horizontal direction (X direction)) in a region where the scribe line 102Y is formed on the surface of the insulating separation film 103.

The dummy interconnects 120 are formed in a pattern in which the distribution density of the dummy interconnects 120 made of aluminum (conductive material) is uniform, i.e., a pattern in a lattice shape in this example.

The pattern formed by the dummy interconnects 120 may be another pattern as long as the distribution density of the dummy interconnects (conductive material) 120 is uniform.

Further, the interval between the dummy interconnects 120 is the same as the smallest interval among the intervals between the electric interconnects 112 formed in the line image sensor IC 110.

That is, the electric interconnects 112 and the dummy interconnects 120 are formed by a semiconductor manufacturing machine of producing the semiconductor image sensor ICs 110. At this time, the dummy interconnects 120 are formed so that the interval between the dummy interconnects 120 is the smallest interval between interconnects, determined by the ability of the semiconductor manufacturing machine.

Specifically, at present, the interval between the dummy interconnects 120 is set to be 0.5 μm to 1 μm.

Further, in the longitudinal direction (X direction) of the line image sensor IC 110, the pattern formed by the dummy interconnects 120 is formed at a center between the end in the longitudinal direction (X direction) of an arbitrary line image sensor IC 110 and the end in the longitudinal direction (X direction) of another line image sensor IC 110 adjacent to the arbitrary line image sensor IC 110 (in a horizontal direction (X direction)).

That is, the dummy interconnects 120 are not formed in the vicinity of the end in the longitudinal direction (X direction) of an arbitrary line image sensor IC 110 and in the vicinity of the end in the longitudinal direction (X direction) of another line image sensor IC 110 adjacent to the arbitrary line image sensor IC 110 (in a horizontal direction (X direction)).

When silicon nitride (SiN) or the like is formed by plasma CVD on the surface of the semiconductor substrate 101 having the scribe lines 102X, 102Y, the insulating separation film 103, the photoelectric conversion elements 111, the electric interconnects 112, the inter-pixel light shielding aluminum 113, and the dummy interconnects 120 in which the distribution density of the conductive material (dummy interconnects 120) is uniform, and the interval between lines is short, the protective film 104 is formed not only on the photoelectric conversion elements 111 arranged in a row in the longitudinal direction (X direction), but also on the region where the dummy interconnects 120 are formed.

Further, the protective film 104 formed on the photoelectric conversion elements 111 arranged in a row, i.e., the protective film 104 of the line image sensor IC 110 is uniform in any portion in the longitudinal direction (X direction) of the line image sensor IC 110.

The reason and mechanism for the uniform thickness of the protective film 104 in any portion in the longitudinal direction (X direction) of the line image sensor IC 110 as described above will be described below.

Specifically, the protective film 104 is formed by forming silicon nitride (SiN) or the like by plasma CVD with respect to the semiconductor substrate 101 on which the dummy interconnects 120 made of a conductive material as well as the electric interconnects 112 and the inter-pixel light shielding aluminum 113 that are conductive materials are formed.

At this time, in a region where the pattern of the dummy interconnects 120 is formed in the region where the scribe line 102 Y is formed, a material gas (plasmolyzed material) proceeding toward the region is deposited to form a film in a region where the dummy interconnects 120 made of a conductive material are formed. Therefore, the protective film 104 is formed on the pattern of the dummy interconnects 120.

Further, in a region where the inter-pixel light shielding aluminum 113 and the electric interconnects 112 that are made of a conductive material (aluminum) (i.e., region to be the line image sensor ICs 110), a material gas (plasmolyzed material) proceeding toward the region is deposited to form a film in the region to be the line image sensor ICs 110. Therefore, the protective film 104 is formed on the region to be the line image sensor ICs 110.

Consequently, the material gas (plasmolyzed material) proceeding toward the region where the pattern of the dummy interconnects 120 is formed is deposited in the region and hardly proceeds toward the end of the line image sensor IC 110. That is, the material gas (plasmolyzed material) proceeding toward the region where the pattern of the dummy interconnects 120 is formed is hardly deposited at the end of the line image sensor IC 110.

This makes the thickness of the protective film 104 uniform in any portion in the longitudinal direction (X direction) of the line image sensor IC 110.

The interval between the dummy interconnects 120 is the same as the smallest interval among the intervals between the electric interconnects 112. That is, since the density between lines of the dummy interconnects 120 is high, the material gas (plasmolyzed material) proceeding toward the region where the pattern of the dummy interconnects 120 is formed is deposited in this region exactly, thereby being prevented from proceeding toward the end of the line image sensor IC 110 without fail. Therefore, the thickness of the protective film 104 of the line image sensor IC 110 can be surely uniformized.

Further, the dummy interconnects 120 has a pattern in which the distribution density of the conductive material (dummy interconnects 120) is uniform, so the thickness of the protective film 104 formed in the region where the pattern of the dummy interconnects 120 is formed is uniform.

Assuming that the distribution density of the conductive material in the pattern of the dummy interconnects 120 is not uniform, the thickness of the protective film 104 formed in this region is not uniform, and a part of the material gas that is not deposited in this region due to the non-uniformity of the thickness may flow to the line image sensor IC 110 side. If such a phenomenon occurs, the material gas flowing to the line image sensor IC 110 side is deposited on the line image sensor IC 110, and the thickness of the protective film 104 of the line image sensor IC 110 may be non-uniform.

In this embodiment, however, the dummy interconnects 120 have a pattern in which the distribution density of the conductive material is uniform, so the thickness of the protective film 104 to be formed in the region where the pattern of the dummy interconnects 120 is formed becomes uniform. Therefore, a part of the material gas on the dummy interconnect 120 side does not flow to the line image sensor IC 110 side, whereby the thickness of the protective film 104 of the line image sensor IC 110 can be uniformized.

The protective film 104 formed on the photoelectric conversion elements 111 and the protective film 104 formed on the dummy interconnects 120 are separated by etching after the deposition of the protective film 104.

Then, the semiconductor substrate is cut along the scribe lines 102X, 102Y by a dicing device (cutting device), whereby line image sensor ICs 110 which are independent of each other are produced.

The thickness of the protective film 104 formed on each line image sensor IC 110 thus produced is uniform in any portion in the longitudinal direction (X direction).

Further, during cutting, the dummy interconnects 120 and the protective film 104 on the dummy interconnects 120 are also cut. However, the protective film 104 on the photoelectric conversion elements 111 and the protective film 104 on the dummy interconnects 120 are separated, so the protective film 104 on the photoelectric elements 111 is not damaged even if the protective film 104 on the dummy interconnects 120 is cut.

As described above, the thickness of the protective film 104 of the line image sensor IC 110 is uniform in any portion in the longitudinal direction (X direction), so the reflection and interference conditions of the protective film 104 and the insulating separation film 103 become equal in any portion in the longitudinal direction (X direction).

Thus, in the case where light of the same amount is incident upon each of the photoelectric conversion elements 111 of the line image sensor IC 110 thus produced, the amount of light actually incident upon each of the photoelectric conversion elements 111 becomes equal, and the values of electric signals sent from the respective photoelectric conversion elements 111 become equal.

Figure 4:
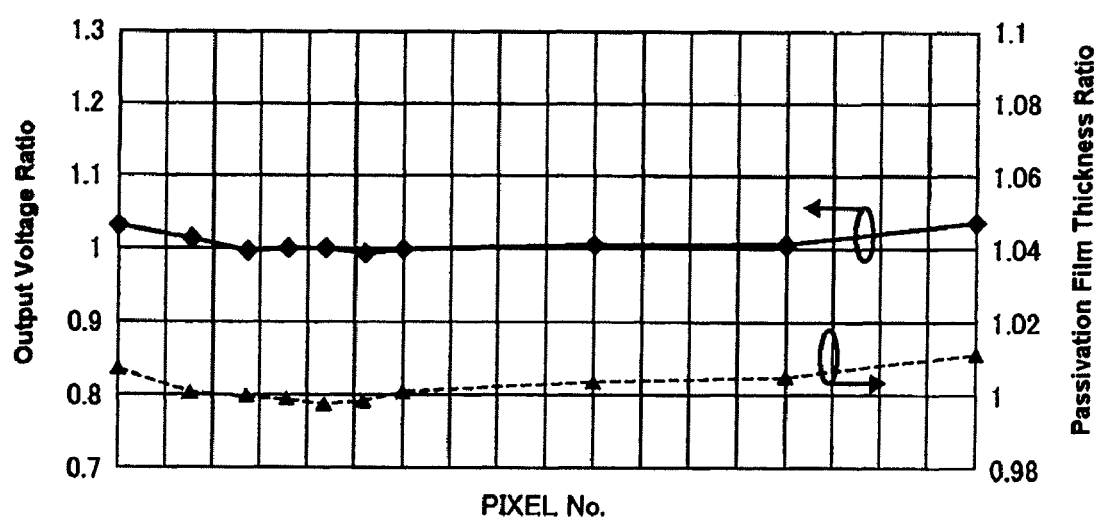
FIG. 4 shows a characteristic diagram showing the variation in thickness and output of a protective film in Embodiment 1.

FIG. 4 shows the thickness of the protective film 104 and the output characteristics of each of the photoelectric conversion elements (pixels) 111 in the line image sensor IC 110 of Embodiment 1.

More specifically, solid line indicates a voltage ratio of electric signals sent from the respective photoelectric conversion elements 111, and dotted line indicates a thickness ratio of the protective film 104 formed on the respective photoelectric conversion elements 111.

FIG. 4 shows that the thickness of the protective film 104 is substantially uniform in the longitudinal direction of the line image sensor IC 110, and the voltage values of electric signals sent from the respective photoelectric conversion elements 111 are substantially uniform.

In FIG. 4, the values of the electric signals sent from the photoelectric conversion elements 111 increase when the thickness ratio (thickness) of the protective film 104 increases. The values of electric signals sent from the photoelectric conversion elements 111 may, however, decrease depending upon the reflection and interference conditions when the thickness ratio (thickness) of the protective film 104 increases.

Since the pattern of the dummy interconnects 120 can be formed simply with a semiconductor manufacturing machine in the same way as in the electric interconnects 112, the photoelectric conversion device according to this Embodiment can be produced easily.

Preferred Embodiment 2

There is also a line image sensor IC in which light-shielding aluminum (second conductive material) is provided above the electric interconnects 112 and the inter-pixel light shielding aluminum 113 (that is, the first conductive material), and the electric interconnects 112, the inter-pixel light shielding aluminum 113, and the light-shielding aluminum are buried with the protective film 104.

The light-shielding aluminum is formed substantially over the entire region of the line image sensor IC, and only a part that is placed above the light-receiving surface 111a of the photoelectric conversion device 111 is opened.

In a photoelectric conversion device having a line image sensor IC that includes not only the first conductive material but also the second conductive material, the dummy interconnects 120 as shown in Embodiment 1 are formed, whereby the thickness of the protective film 104 formed in the line image sensor IC can be uniformized.

Preferred Embodiment 3

Next, a method of producing a photoelectric conversion device and a method of producing a line image sensor IC according to Embodiment 3 of the present invention will be described with reference to FIGS. 5A to 5F.

According to the production method of Embodiment 3, the photoelectric conversion device of Embodiment 1 can be produced.

Figure 5A:
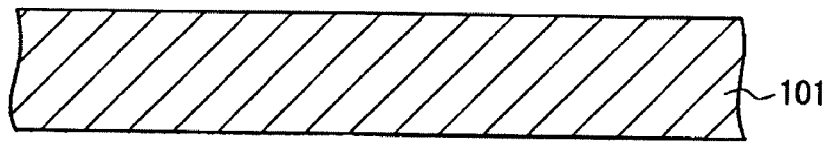
FIG. 5A shows an explanatory view illustrating one step of a production method in Embodiment 3 of the present invention.

First, as shown in FIG. 5A, a semiconductor substrate (P-type silicon substrate) 101 is prepared.

Figure 5B:
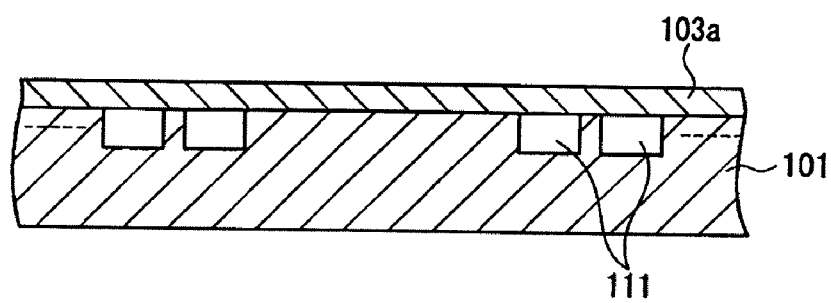
FIG. 5B shows an explanatory view illustrating one step of a production method in Embodiment 3 of the present invention.

Next, as shown in FIG. 5B, a local oxidation of silicon (LOCOS) oxide film 103a, which is an element separation film, is formed on the surface of the semiconductor substrate 101. N-type regions constituting N-wells, P-wells, and photoelectric conversion elements (pixels) 111 of a CMOS transistor forming a signal processing circuit are formed by ion implantation. The photoelectric conversion elements 111 function as light-receiving portions of the line image sensor IC.

Next, a gate oxide film is formed, polysilicon is deposited by CVD, and a gate of the CMOS transistor is formed by etching.

Next, an N-type region and a P-type region to be a drain region and a source region of the CMOS transistor are formed by ion implantation.

Figure 5C:
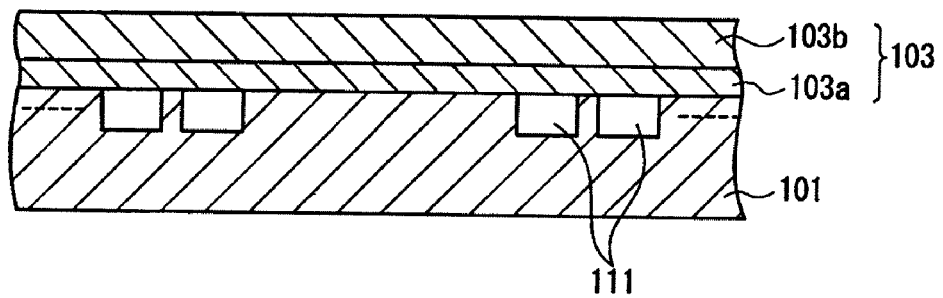
FIG. 5C shows an explanatory view illustrating one step of a production method in Embodiment 3 of the present invention.

Next, as shown in FIG. 5C, a boro-phospho silicate glass (BPSG) film is deposited as an intermediate insulating film 103b by CVD, and contact holes are formed by etching.

An insulating separation film 103 is formed of the oxide film 103a and the intermediate insulating film 103b.

Figure 5D:
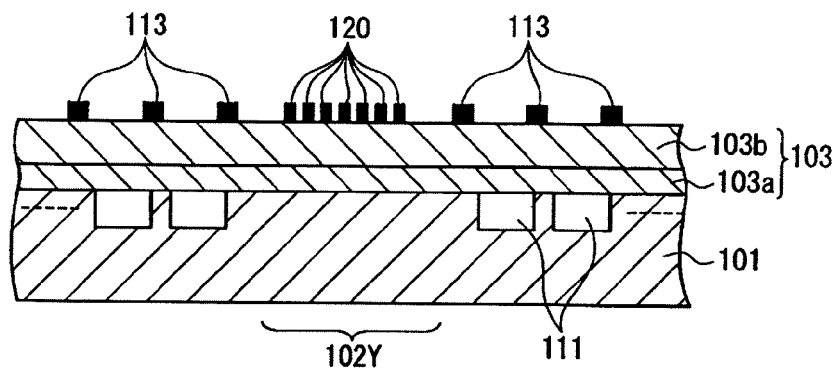
FIG. 5D shows an explanatory view illustrating one step of a production method in Embodiment 3 of the present invention.

Next, as shown in FIG. 5D, an aluminum (conductive material) film is deposited on the surface of the intermediate insulating film 103a, and desired electric wiring is formed by etching. At this time, inter-pixel light shielding aluminum 113 is formed at a position between adjacent photoelectric conversion elements 111, and simultaneously, dummy interconnects 120 are formed on a scribe line 102Y. At this time, the dummy interconnects 120 are formed in a region where the short side of an arbitrary line image sensor IC is opposed to the short side of another line image sensor IC adjacent to the arbitrary line image sensor IC.

Figure 5E:
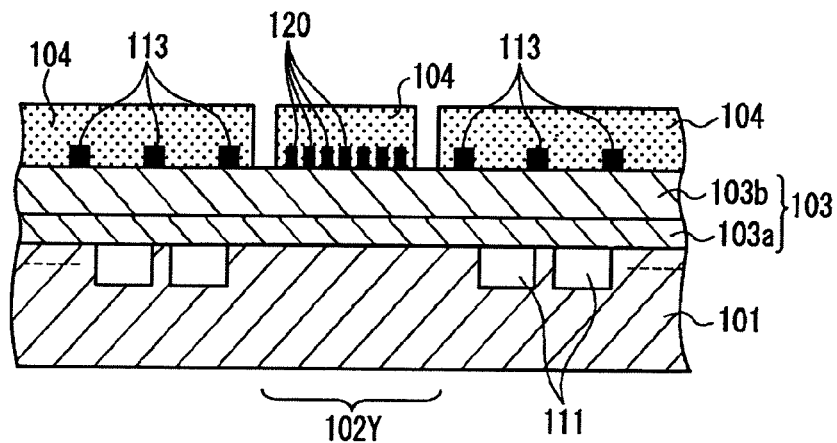
FIG. 5E shows an explanatory view illustrating one step of a production method in Embodiment 3 of the present invention.

Next, as shown in FIG. 5E, a protective film 104 of a silicon nitride film is formed on the surface of the intermediate insulating film 103b by plasma CVD. At this time, the protective film 104 between the photoelectric conversion elements 111 and the dummy interconnects 120 is removed by etching.

The steps shown in FIGS. 5A to 5E are production steps of a wafer (photoelectric conversion device). The photoelectric conversion device shown in FIG. 5E is cut by a dicing device to be divided into line image sensor ICs 110 which are independent of each other.

Figure 5F:
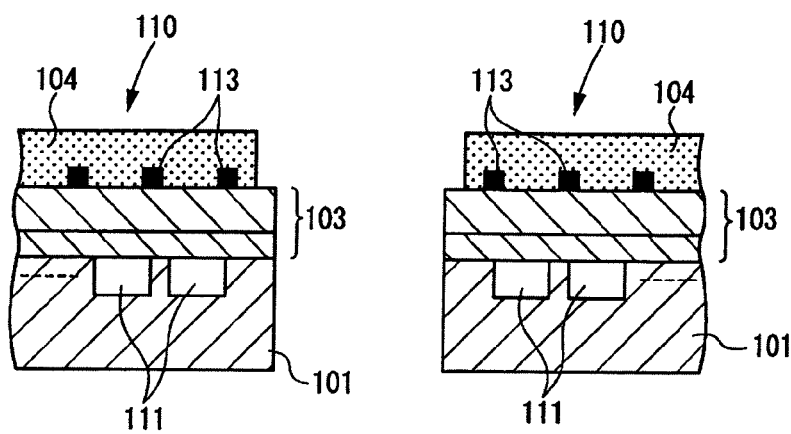
FIG. 5F shows an explanatory view illustrating one step of a production method in Embodiment 3 of the present invention.

That is, as shown in FIG. 5F, the semiconductor substrate 101 is cut along the scribe lines 102Y, 102X by the dicing device. At this time, the dummy interconnects 120 are also cut simultaneously. Then, the line image sensor ICs 110 independent of each other can be produced.

In the description of Embodiment 3, the element separation layer is the LOCOS oxide film 103a; however, the burying oxide film of shallow trench isolation (STI) or the like may be set to be an element separation layer, for example.

Further, the ion implantation of the N-type regions constituting the N-wells, P-wells, and the pixels may be performed before the element separation layer is formed.

Preferred Embodiment 4

Embodiment 3 is the production method in the case of using one aluminum film. In Embodiment 4, a production method using two aluminum films will be described with reference to FIGS. 6A to 6C.

The photoelectric conversion device of Embodiment 2 can be produced by the production method of Embodiment 4.

According to the production method using two aluminum films, the surface of the semiconductor substrate 101 is subjected to the steps shown in FIGS. 5A to 5C in the same way as in Embodiment 3, whereby the contact holes are formed.

Figure 6A:
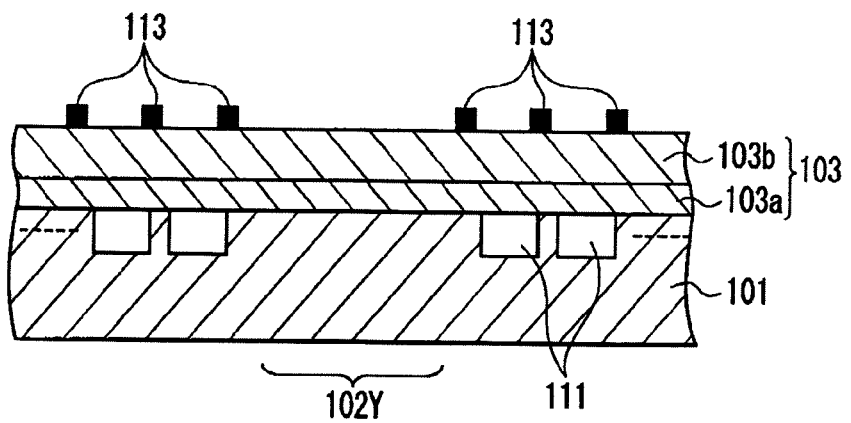
FIG. 6A shows an explanatory view illustrating one step of a production method in Embodiment 4 of the present invention.

After the contact holes are formed, a first aluminum film is deposited on the surface of the intermediate insulating film 103b, and a desired electric wiring is formed by etching. At this time, as shown in FIG. 6A, an inter-pixel light shielding aluminum 113 is formed at a position between adjacent photoelectric conversion elements 111.

Next, an insulating film 103A of tetra ethoxy silane (TEOS) is deposited on the surface of the intermediate insulating film 103b, and the insulating film 103A is flattened by chemical mechanical polishing (CMP), etch back, or the like, whereby via holes are formed.

After the via holes are formed, a second aluminum film is formed on the surface of the insulating film 103A. At this time, as shown in FIG. 6B, inter-pixel light shielding aluminum 113A is formed at a position between adjacent photoelectric conversion elements 111, and simultaneously, dummy interconnects 120 are formed on the scribe line 102Y.

Figure 6B:
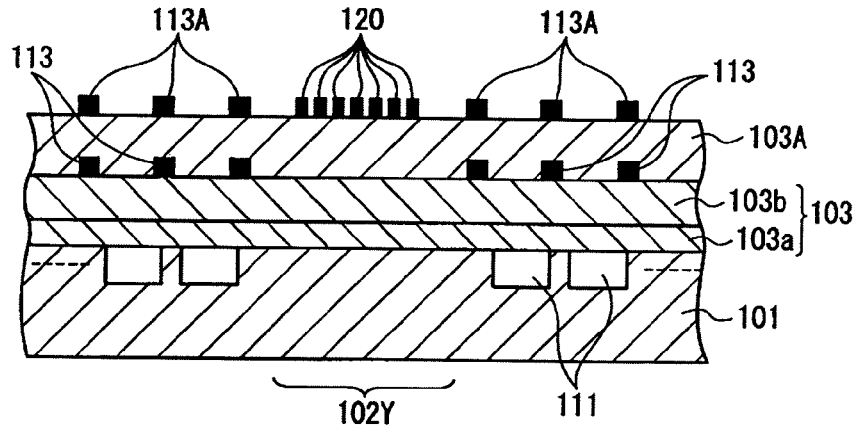
FIG. 6B shows an explanatory view illustrating one step of a production method in Embodiment 4 of the present invention.
Figure 6C:
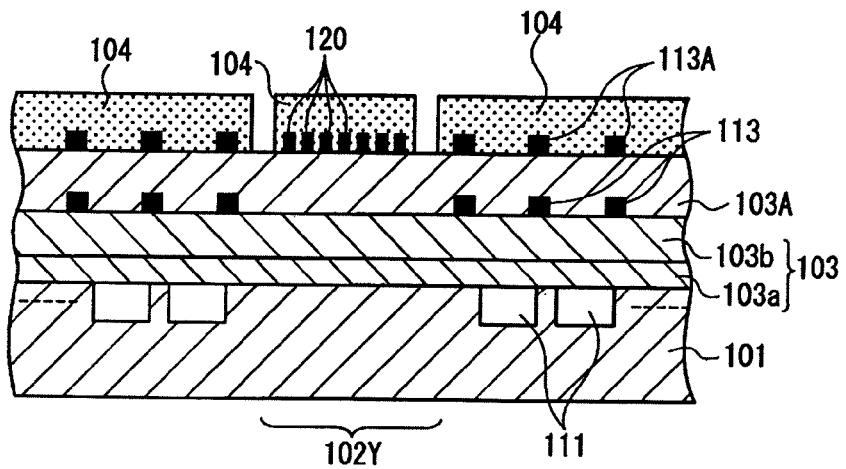
FIG. 6C shows an explanatory view illustrating one step of a production method in Embodiment 4 of the present invention.
Figure 7:
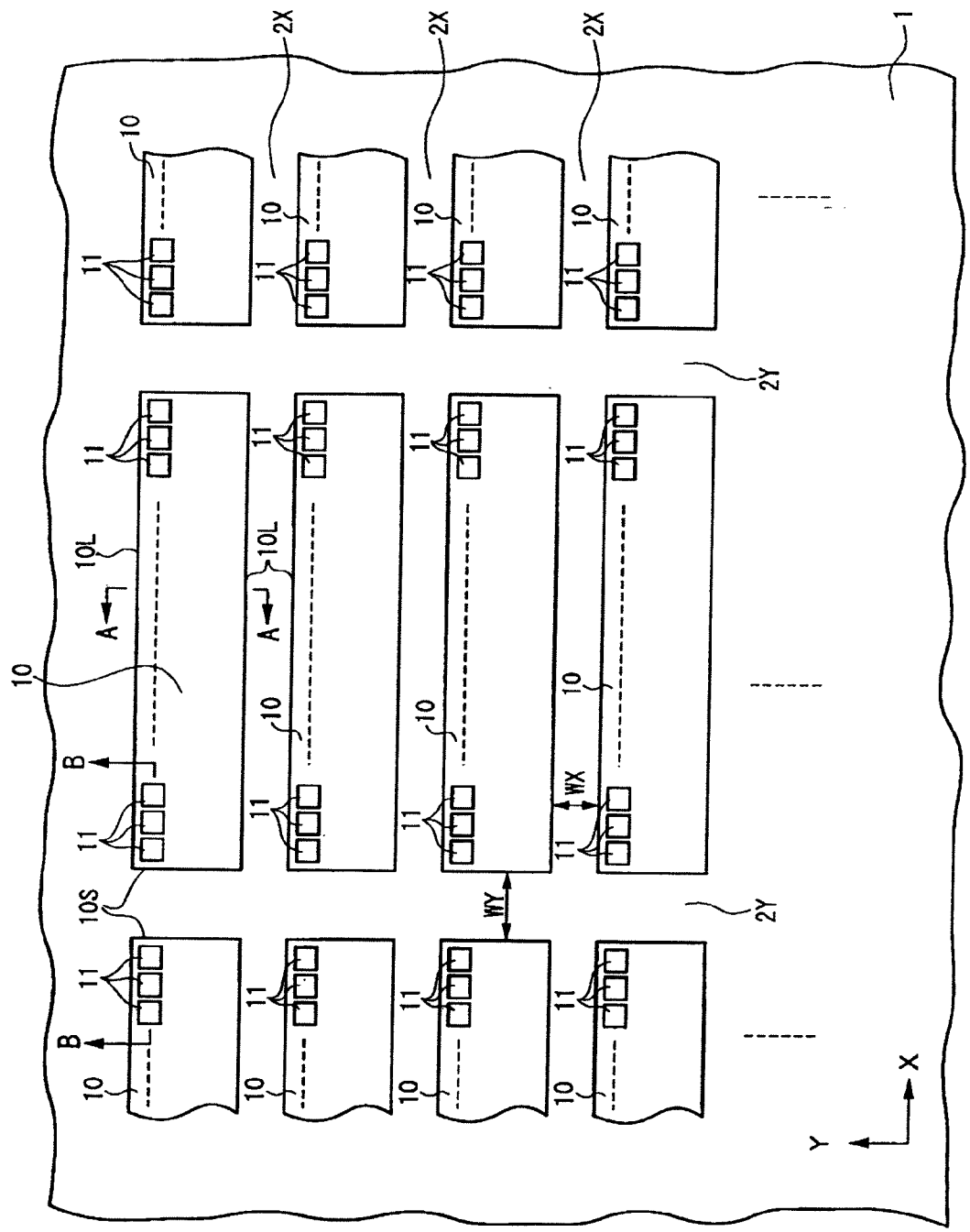
FIG. 7 shows a plan view showing a photoelectric conversion device according to a conventional art.
Figure 8:
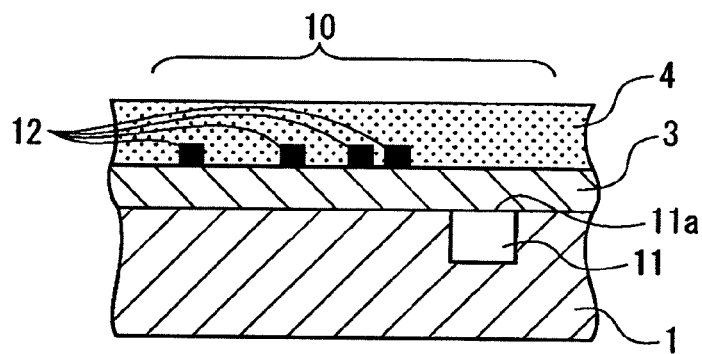
FIG. 8 shows a cross-sectional view taken along a line A-A in FIG. 7.
Figure 9:
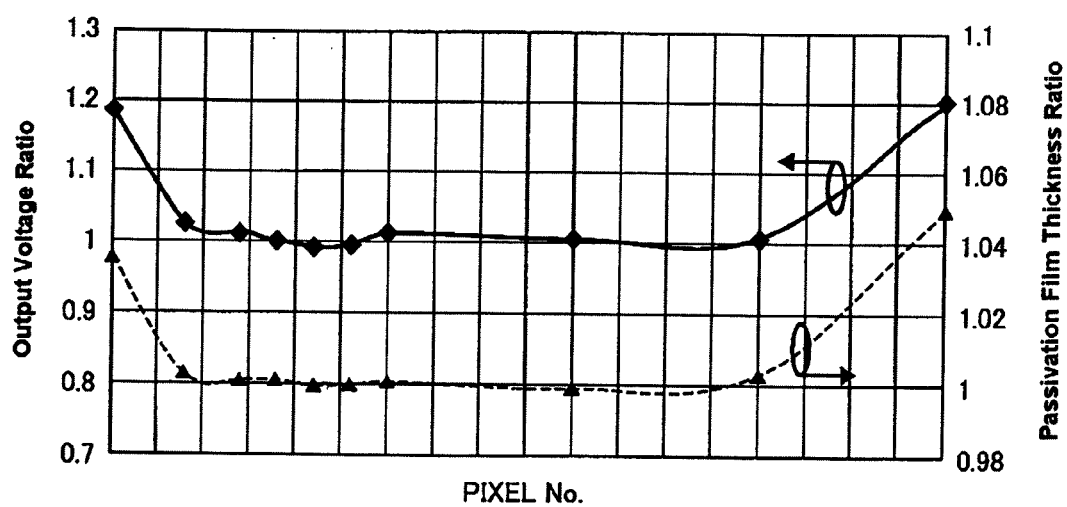
FIG. 9 shows a characteristic diagram showing the variation in thickness and output of a protective film according to a conventional art.

Next, as shown in FIG. 6C, a protective film 104 of a silicon nitride film is formed on the surface of the insulating film 103a by plasma CVD. At this time, the protective film 104 between the photoelectric conversion elements 111 and the dummy interconnects 120 is removed by etching.

The steps shown in FIGS. 6A to 6C are production steps of a wafer (photoelectric conversion device). The photoelectric conversion device shown in FIG. 6C is cut by a dicing device to be divided into line image sensor ICs which are independent of each other.

When the photoelectric conversion device is divided by dicing, the dummy interconnects 120 are also cut simultaneously. Then, line image sensor ICs independent of each other can be produced.

In Embodiment 4, two aluminum films are used, and the inter-pixel light shielding aluminum 113, 113A are formed of both of the first and second aluminum layers. However, an inter-pixel light shielding aluminum may be formed of either one of the first aluminum film and the second aluminum film.

What is claimed is:

1. A photoelectric conversion device, comprising:
a semiconductor substrate;
a plurality of rectangular line image sensor ICs formed on a surface of the semiconductor substrate with gaps therebetween;
a plurality of scribe lines formed in the gaps between adjacent line image sensor ICs;
a plurality of dummy interconnects made of a conductive material formed in a region where a short side of an arbitrary line image sensor IC is opposed to a short side of another line image sensor IC adjacent to the arbitrary line image sensor IC in a region where one of the plurality of scribe lines is formed along the short sides of the plurality of rectangular line image sensor ICs; and
a protective film formed by plasma CVD so as to cover the plurality of dummy interconnects as well as the surface of the semiconductor substrate.

2. A photoelectric conversion device, comprising:
a semiconductor substrate;
a plurality of rectangular line image sensor ICs formed on a surface of the semiconductor substrate with gaps therebetween;
a plurality of scribe lines formed in the gaps between adjacent line image sensor ICs;
a plurality of dummy interconnects made of a conductive material formed in a region where a short side of an arbitrary line image sensor IC is opposed to a short side of another line image sensor IC adjacent to the arbitrary line image sensor IC in a region where one of the plurality of scribe lines is formed along the short sides of the plurality of rectangular line image sensor ICs; and
a protective film formed by plasma CVD so as to cover the plurality of dummy interconnects as well as the surface of the semiconductor substrate,
wherein the plurality of dummy interconnects are formed in a pattern in which a distribution density of the plurality of dummy interconnects is uniform, and an interval between the plurality of dummy interconnects is equal to a smallest interval among intervals between electric interconnects formed in each of the plurality of line image sensor ICs.

3. A photoelectric conversion device, comprising:
a semiconductor substrate;
a plurality of rectangular line image sensor ICs formed on a surface of the semiconductor substrate with gaps therebetween;
a plurality of scribe lines formed in the gaps between adjacent line image sensor ICs;
a plurality of dummy interconnects made of a conductive material formed in a region at a center between a short side of an arbitrary line image sensor IC and a short side of another line image sensor IC adjacent to the arbitrary line image sensor IC in a region where one of the plurality of scribe lines is formed along the short sides of the plurality of rectangular line image sensor ICs, among the plurality of scribe lines; and
a protective film formed by plasma CVD so as to cover the plurality of dummy interconnects as well as the surface of the semiconductor substrate,
wherein the plurality of dummy interconnects are formed in a pattern in which a distribution density of the plurality of dummy interconnects is uniform, and an interval between the plurality of dummy interconnects is equal to a smallest interval among intervals between electric interconnects formed in each of the plurality of line image sensor ICs.

4. A method of producing the photoelectric conversion device according to claim 1, comprising:
forming a plurality of photoelectric conversion elements to be light-receiving portions of a line image sensor IC on a surface of a semiconductor substrate;
forming an insulating film on the surface of the semiconductor substrate on which the plurality of photoelectric conversion element are formed;
depositing a conductive film on a surface of the insulating film, and etching the deposited conductive film, thereby forming a plurality of electric interconnects, an inter-pixel light shielding conductive material positioned between the plurality of photoelectric conversion elements, and a plurality of dummy interconnects positioned between a short side of an arbitrary line image sensor IC and a short side of another line image sensor IC adjacent to the arbitrary line image sensor IC; and
forming a protective film by plasma CVD on the surface of the insulating film on which the plurality of electric interconnects, the inter-pixel light shielding conductive material, and the plurality of dummy interconnects are formed.

5. A method of producing an independent line image sensor IC by cutting the photoelectric conversion device according to claim 1 along scribe lines, comprising:
forming a plurality of photoelectric conversion elements to be light-receiving portions of the line image sensor IC on a surface of a semiconductor substrate;
forming an insulating film on the surface of the semiconductor substrate on which the plurality of photoelectric conversion elements are formed;
depositing a conductive film on a surface of the insulating film, and etching the deposited conductive film, thereby forming a plurality of electric interconnects, an inter-pixel light shielding conductive material positioned between the photoelectric conversion elements, and a plurality of dummy interconnects positioned between a short side of an arbitrary line image sensor IC and a short side of another line image sensor IC adjacent to the arbitrary line image sensor IC;
forming a protective film by plasma CVD on the surface of the insulating film on which the plurality of electric interconnects, the inter-pixel light shielding conductive material, and the plurality of dummy interconnects are formed to form the photoelectric conversion device; and
cutting the photoelectric conversion device along the scribe lines to produce the independent line image sensor IC.

* * * * *